US011502685B2

(12) United States Patent
Karasawa et al.

(10) Patent No.: US 11,502,685 B2
(45) Date of Patent: Nov. 15, 2022

(54) GATE DRIVE CIRCUIT AND CONTROL CIRCUIT FOR SWITCHING CIRCUIT, AND SWITCHING POWER SUPPLY

(71) Applicant: ROHM Co., LTD., Kyoto (JP)

(72) Inventors: Shinya Karasawa, Kyoto (JP); Hiroki Niikura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 42 days.

(21) Appl. No.: 17/109,351

(22) Filed: Dec. 2, 2020

(65) Prior Publication Data

US 2021/0167774 A1 Jun. 3, 2021

(30) Foreign Application Priority Data

Dec. 3, 2019 (JP) .............................. JP2019-218941

(51) Int. Cl.
| | |
|---|---|
| *H03K 17/693* | (2006.01) |
| *H02M 3/158* | (2006.01) |
| *H02M 1/38* | (2007.01) |
| *H02M 1/08* | (2006.01) |
| *H02M 3/335* | (2006.01) |

(52) U.S. Cl.
CPC ............ *H03K 17/693* (2013.01); *H02M 1/08* (2013.01); *H02M 1/385* (2021.05); *H02M 3/1588* (2013.01); *H02M 3/33553* (2013.01); *H03K 2217/0072* (2013.01); *H03K 2217/0081* (2013.01)

(58) Field of Classification Search
CPC ......... H03K 17/693; H03K 2217/0072; H03K 2217/0081; H03K 17/08122; H02M 1/385; H02M 3/1588; H02M 3/015; H02M 3/33553; Y02B 70/10
See application file for complete search history.

(56) References Cited

U.S. PATENT DOCUMENTS

| | | | | |
|---|---|---|---|---|
| 5,754,065 | A | * | 5/1998 | Wong ..................... H02M 7/538 327/108 |
| 6,118,336 | A | * | 9/2000 | Pullen .................... H03F 3/2171 330/10 |
| 7,145,316 | B1 | * | 12/2006 | Galinski, III ........... H02M 1/08 323/283 |
| 7,872,883 | B1 | * | 1/2011 | Elbanhawy ......... H02M 3/1588 363/25 |

(Continued)

*Primary Examiner* — Yusef A Ahmed
(74) *Attorney, Agent, or Firm* — Chip Law Group

(57) ABSTRACT

A gate drive circuit in a switching circuit including a switching terminal connected to a node that is connected to a high-side transistor and a low-side transistor, and connected to an end of a boot-strap capacitor, a bootstrap terminal connected to another end of the bootstrap capacitor, a high-side driver having an output terminal connected to a gate of the high-side transistor, an upper power supply node connected to the bootstrap terminal, and a lower power supply node connected to the switching terminal, a low-side driver having an output terminal connected to a gate of the low-side transistor, a rectifying device for applying a constant voltage to the bootstrap terminal, and a dead time controller for controlling a length of a dead time during which the high-side transistor and the low-side transistor are simultaneously turned off, based on a potential difference between the bootstrap terminal and the switching terminal.

10 Claims, 13 Drawing Sheets

(56) References Cited

U.S. PATENT DOCUMENTS

| | | | | |
|---|---|---|---|---|
| 8,553,430 | B2* | 10/2013 | Melanson | H02M 1/42 363/97 |
| 8,593,211 | B2* | 11/2013 | Forghani-Zadeh | H03K 17/08122 327/108 |
| 8,976,543 | B1* | 3/2015 | Zheng | H02M 3/337 363/17 |
| 10,098,194 | B1* | 10/2018 | Xiong | H05B 45/355 |
| 10,320,303 | B1* | 6/2019 | Xiong | H05B 45/305 |
| 10,476,399 | B1* | 11/2019 | Xiong | H05B 45/39 |
| 10,483,864 | B1* | 11/2019 | Xiong | H02M 3/3376 |
| 10,756,644 | B1* | 8/2020 | Shah | H02J 7/02 |
| 10,862,399 | B1* | 12/2020 | Rai | H02M 1/32 |
| 11,133,797 | B1* | 9/2021 | Wu | H01L 29/7835 |
| 11,271,484 | B2* | 3/2022 | Rai | H02M 3/33538 |
| 2005/0057239 | A1* | 3/2005 | Fowler | H03K 17/063 323/282 |
| 2006/0273774 | A1* | 12/2006 | Galinski, III | H02M 1/08 323/288 |
| 2008/0100378 | A1* | 5/2008 | Bernacchia | H02M 7/5388 327/589 |
| 2009/0213631 | A1* | 8/2009 | Inoue | H02M 1/32 363/127 |
| 2010/0072967 | A1* | 3/2010 | Kamishinbara | H02M 3/158 323/284 |
| 2012/0299569 | A1* | 11/2012 | Zhang | H02M 3/1563 323/283 |
| 2013/0229829 | A1* | 9/2013 | Zhang | H02M 3/33569 363/16 |
| 2013/0241621 | A1* | 9/2013 | Forghani-Zadeh | H03K 17/08122 327/315 |
| 2014/0002047 | A1* | 1/2014 | Houston | H02M 3/156 323/283 |
| 2014/0226369 | A1* | 8/2014 | Kimura | H02M 3/3376 363/21.09 |
| 2014/0307483 | A1* | 10/2014 | Sigamani | H02M 3/33546 363/21.04 |
| 2015/0042298 | A1* | 2/2015 | Kung | H02M 3/158 323/271 |
| 2015/0188425 | A1* | 7/2015 | Chang | H03K 17/063 323/271 |
| 2016/0011610 | A1* | 1/2016 | Hayashi | H03K 17/162 323/280 |
| 2016/0065071 | A1* | 3/2016 | Mats | H02M 1/32 323/268 |
| 2016/0359421 | A1* | 12/2016 | Lin | H02M 1/08 |
| 2017/0025961 | A1* | 1/2017 | Seeman | H02M 3/33546 |
| 2017/0110971 | A1* | 4/2017 | Degen | H02M 1/32 |
| 2017/0126140 | A1* | 5/2017 | Yu | H02M 1/36 |
| 2017/0133929 | A1* | 5/2017 | Matsuki | H02M 1/32 |
| 2017/0324345 | A1* | 11/2017 | Stuler | H02M 1/08 |
| 2018/0159529 | A1* | 6/2018 | Reusch | H02M 3/158 |
| 2018/0183320 | A1* | 6/2018 | Shen | H02M 1/08 |
| 2019/0165681 | A1* | 5/2019 | Liu | H02M 3/33507 |
| 2020/0036372 | A1* | 1/2020 | Shankar | H02M 1/08 |
| 2020/0162074 | A1* | 5/2020 | Niikura | H03K 17/04123 |
| 2020/0169160 | A1* | 5/2020 | Kikuchi | H02M 1/083 |
| 2020/0412231 | A1* | 12/2020 | Khamesra | H02H 1/0007 |
| 2021/0050782 | A1* | 2/2021 | Bandyopadhyay | H02M 3/158 |
| 2021/0058000 | A1* | 2/2021 | Ahmed | H02M 3/33523 |
| 2021/0083572 | A1* | 3/2021 | Yen | H02M 3/073 |
| 2021/0126538 | A1* | 4/2021 | Puia | H02M 1/08 |
| 2021/0203239 | A1* | 7/2021 | Karasawa | G01R 1/203 |
| 2022/0006450 | A1* | 1/2022 | Fontana | H03K 17/063 |

* cited by examiner

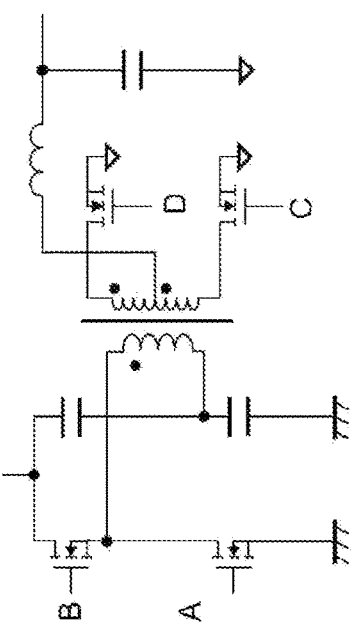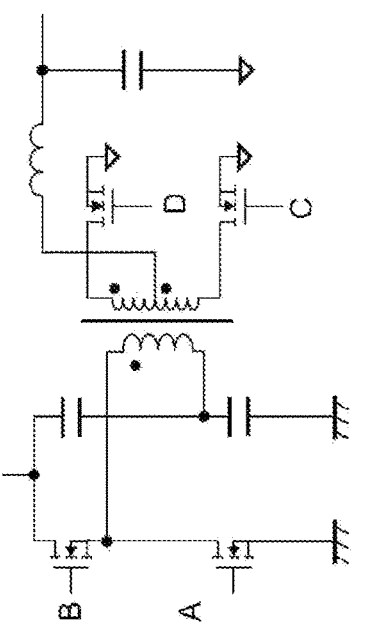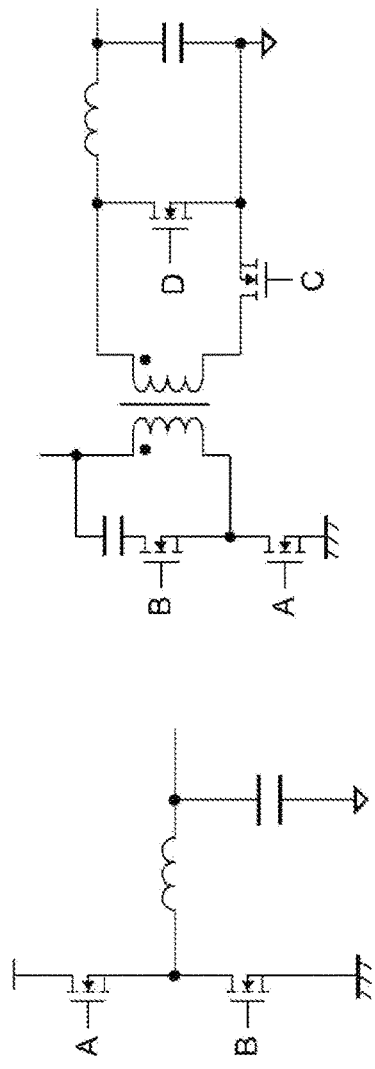
FIG.10A   FIG.10B   FIG.10C
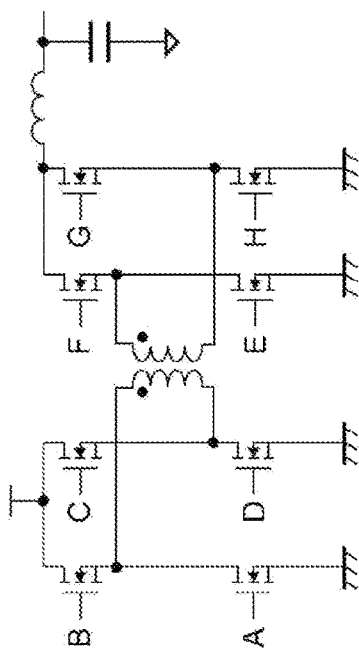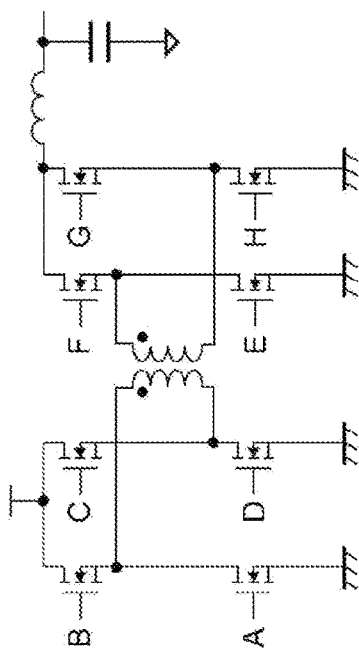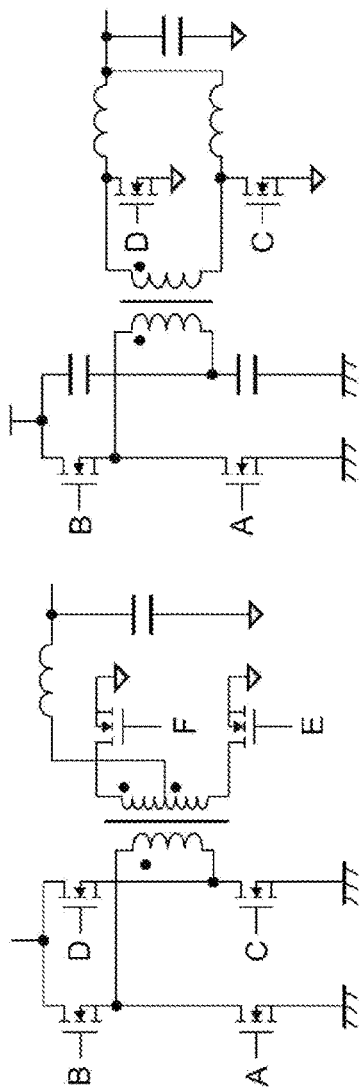
FIG.10D   FIG.10E   FIG.10F

GATE DRIVE CIRCUIT AND CONTROL CIRCUIT FOR SWITCHING CIRCUIT, AND SWITCHING POWER SUPPLY

CROSS REFERENCE TO RELATED APPLICATIONS

This application claims priority benefit of Japanese Patent Application No. JP 2019-218941 filed in the Japan Patent Office on Dec. 3, 2019. Each of the above-referenced applications is hereby incorporated herein by reference in its entirety.

The present disclosure relates to a switching circuit.

Switching circuits such as half-bridge circuits and full-bridge circuits are used in the field of power electronics including direct current/direct current (DC/DC) converters, alternating current/direct current (AC/DC) converters, and inverters.

FIG. 1 of the accompanying drawings is a circuit diagram of a switching circuit 100R. The switching circuit 100R includes a high-side transistor MH and a low-side transistor ML that are connected in series to each other and a gate drive circuit 200R for driving the high-side transistor MH and the low-side transistor ML. The gate drive circuit 200R controls the turning on and off of the high-side transistor MH and the low-side transistor ML for switching a switching terminal SW between two states including a high state at an input voltage $V_{IN}$ and a low state at a ground voltage 0 or three states including the high state, the low state, and a high impedance state.

The gate drive circuit 200R includes a high-side driver 202, a low-side driver 204, and a rectifying device D1. The high-side transistor MH is an N-channel transistor, and it may require a drive voltage higher than the input voltage $V_{IN}$, to turn on the high-side transistor MH. A bootstrap circuit is used to generate a drive voltage higher than the input voltage $V_{IN}$. The rectifying device D1 and a bootstrap capacitor CB as an add-on jointly make up a bootstrap circuit. The bootstrap capacitor CB has one end connected to the switching terminal SW of the switching circuit 100R. A constant voltage $V_{REG}$ is applied through the rectifying device D1 to the other end of the switching terminal SW.

When the switching terminal SW is low, i.e., 0 V, the bootstrap capacitor CB is charged at the constant voltage $V_{REG}$. If the low-side driver 204 produces a low output and the high-side driver 202 produces a high output, then a bootstrap voltage $V_B$ is applied to the gate of the high-side transistor MH. As a voltage $V_S$ at the switching terminal SW, i.e., a source voltage of the high-side transistor MH, rises, the bootstrap voltage $V_B$ rises accordingly, so that a drive voltage higher than a threshold value can be applied between the gate and source of the high-side transistor MH.

Heretofore, silicon (Si) metal-oxide semiconductor field-effect transistors (MOSFETs) or bipolar transistors have been used as switching elements. In recent years, attention has been drawn to high-electron-mobility transistors (HEMTs) of gallium nitride (GaN) as an alternative. GaN-HEMTs have excellent frequency characteristics, a low dynamic resistance, and a high withstand voltage, and are expected to make DC/DC converters more efficient and smaller in size by replacing Si devices.

In FIG. 1, if the high-side transistor MH and the low-side transistor ML are constructed as GaN-HEMTs, then an overvoltage may possibly be applied to the bootstrap capacitor CB. The reason for the overvoltage will be described below.

When the high-side transistor MH and the low-side transistor ML are simultaneously turned on, a through current flows. In order to prevent a through current from flowing, there is inserted a dead time during which both the high-side transistor MH and the low-side transistor ML are turned off. In some applications including DC/DC converters, a reverse current flows during a dead time when the switching circuit 100R changes from a low output to a high output. In a case where the high-side transistor MH and the low-side transistor ML are constructed as Si-MOSFETs, the voltage $V_S$ at the switching terminal SW is clamped to −Vf due to the body diode of the low-side transistor ML. Therefore, providing the voltage drop across the rectifying device D1 is ignored, the voltage applied across the bootstrap capacitor CB is clamped to a voltage of $V_{REG}$+Vf.

On the other hand, in a case where the high-side transistor MH and the low-side transistor ML are constructed as GaN-HEMTs, since the GaN-HEMTs have no body diode, when a reverse current flows through the low-side transistor ML, its drain-to-source voltage $V_{DS}$ is of a very large value of several V. Therefore, a voltage of $V_{REG}$+$V_{DS}$ is applied across the bootstrap capacitor CB, overcharging the bootstrap capacitor CB.

If the high-side driver 202 produces a high output while the bootstrap capacitor CB is being overcharged, then an overvoltage is applied between the gate and source of the high-side transistor MH, tending to lower the reliability of the high-side transistor MH.

According to an embodiment of the present disclosure, it is necessary to clamp the voltage across the bootstrap capacitor CB. For example, U.S. Pat. No. 8,593,211B2 discloses related art.

SUMMARY

It is therefore desirable to provide a gate drive circuit that is capable of restraining a bootstrap capacitor from being overcharged according to an approach different from that of the related art.

According to a mode of the present disclosure, there is provided a gate drive circuit for use in a switching circuit including a high-side transistor and a low-side transistor that are connected in series to each other. The gate drive circuit includes a switching terminal connected to a node that is connected to the high-side transistor and the low-side transistor, and also connected to an end of a bootstrap capacitor, a bootstrap terminal connected to another end of the bootstrap capacitor, a high-side driver having an output terminal connected to a gate of the high-side transistor, an upper power supply node connected to the bootstrap terminal, and a lower power supply node connected to the switching terminal, a low-side driver having an output terminal connected to a gate of the low-side transistor, a rectifying device for applying a constant voltage to the bootstrap terminal, and a dead time controller for controlling a length of a dead time during which the high-side transistor and the low-side transistor are simultaneously turned off, on the basis of a potential difference between the bootstrap terminal and the switching terminal.

The inventor of the present disclosure has found that the length of the dead time and the voltage charged across a bootstrap capacitor have a positive correlation. The bootstrap capacitor is prevented from being overcharged by controlling the length of the dead time.

In the gate drive circuit, the dead time controller may include a comparator for comparing the potential difference with a predetermined target voltage, and increase or reduce the dead time depending on an output signal from the comparator. The comparator may be a digital comparator or an analog comparator.

In the gate drive circuit, the dead time controller may feedback-control the dead time in order to cause the potential difference to approach a predetermined target voltage.

In the gate drive circuit, the dead time controller may control a dead time during which the high-side transistor is turned on and a dead time during which the low-side transistor is turned on, independently of each other.

According to another mode of the present disclosure, there is provided a control circuit for controlling a switching circuit including a high-side transistor, a low-side transistor, and a gate drive circuit connected to a bootstrap capacitor, for driving the high-side transistor on the basis of a high-side pulse signal and driving the low-side transistor on the basis of a low-side pulse signal. The control circuit includes a pulse modulator for generating a pulse signal that is modulated in order to cause a feedback signal to approach a predetermined target value, and a dead time controller for generating the high-side pulse signal and the low-side pulse signal on the basis of the pulse signal, in which the dead time controller controls a length of a dead time during which the high-side transistor and the low-side transistor are simultaneously turned off, on the basis of a voltage across the bootstrap capacitor.

In the control circuit, the dead time controller may include a comparator for comparing the voltage across the bootstrap capacitor with a predetermined target voltage, and increase or reduce the dead time depending on an output signal from the comparator.

In the control circuit, the dead time controller may feedback-control the dead time in order to cause the voltage across the bootstrap capacitor to approach the predetermined target voltage.

In the control circuit, the dead time controller may control a dead time during which the high-side transistor is turned on and a dead time during which the low-side transistor is turned on, independently of each other.

In the control circuit, the switching circuit may be part of a switching power supply. Alternatively, the switching circuit may be part of a motor driver.

In the control circuit, the switching power supply may be an insulated power supply, the gate drive circuit may be disposed on a primary side of the insulated power supply, the control circuit may be disposed on a secondary side of the insulated power supply, and the high-side pulse signal and the low-side pulse signal may be supplied through a coupler to the gate drive circuit.

Given combinations of the components described above and replacements of the components and expressions of the present disclosure between processes, apparatuses, and systems are also effective as other modes of the present disclosure.

According to the modes of the present disclosure, it is possible to restrain the bootstrap capacitor from being overcharged.

BRIEF DESCRIPTION OF THE DRAWINGS

FIGS. 10A through 10F are circuit diagrams of DC/DC converters each incorporating the gate drive circuit;

DETAILED DESCRIPTION OF THE PREFERRED EMBODIMENTS

Figure 1:
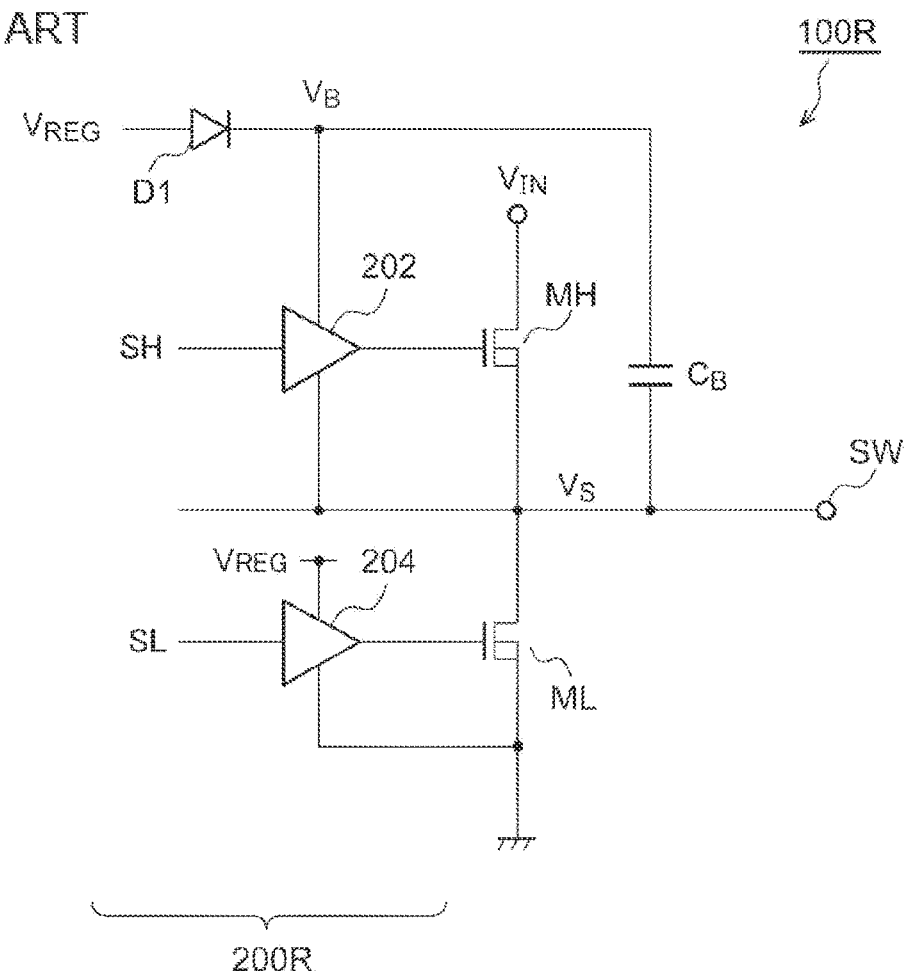
FIG. 1 is a circuit diagram, partly in block form, of a switching circuit according to the related art.

Preferred embodiments of the present disclosure will hereinafter be described in detail below with reference to the drawings. Components, members, and processes that are identical or equivalent to each other in the drawings will be denoted by identical reference characters, and their redundant description will be omitted. The embodiments do not limit the present disclosure and are illustrative, and all features and combinations thereof described in the embodiments may not necessarily be essential to the disclosure.

In the present description, a state where "a member A is connected to a member B" covers a state where the member A and the member B are physically connected directly to each other and a state where the member A and the member B are connected indirectly to each other through another member that may not essentially affect the electrical connection therebetween or that does not impair functions or effects provided by their connection.

Similarly, a state where "a member C is provided between a member A and a member B" covers a state where the member A and the member C or the member B and the member C are connected directly to each other and a state where they are connected indirectly to each other through another member that may not essentially affect the electrical connection therebetween or that does not impair functions or effects provided by their connection.

Embodiment 1

Figure 2:
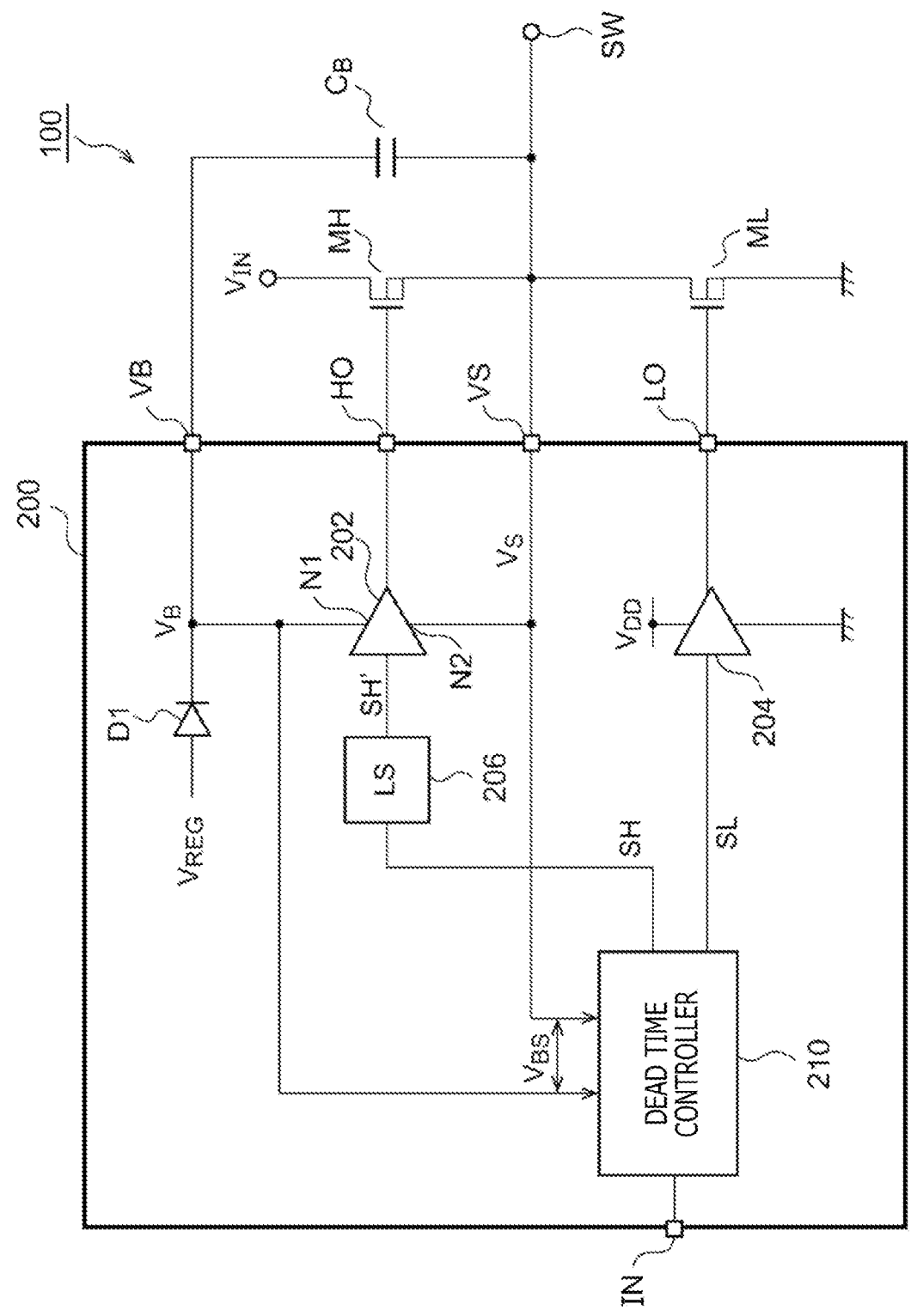
FIG. 2 is a circuit diagram, partly in block form, of a switching circuit incorporating a gate drive circuit according to Embodiment 1 of the present disclosure.

FIG. 2 is a circuit diagram, partly in block form, of a switching circuit 100 incorporating a gate drive circuit 200 according to Embodiment 1 of the present disclosure. The switching circuit 100 includes a high-side transistor MH, a low-side transistor ML, a bootstrap capacitor CB, and the gate drive circuit 200. The high-side transistor MH and the low-side transistor ML are constructed as GaN-HEMTs (GaN-field effect transistors (FETs)).

The gate drive circuit 200 receives a pulsed input signal at its input pin or terminal IN, and controls the high-side transistor MH and the low-side transistor ML in response to the input signal IN. When the input signal IN is high, for example, the high-side transistor MH is turned on and the low-side transistor ML is turned off, making a voltage $V_S$ at a switching terminal SW high. When the input signal IN is low, the high-side transistor MH is turned off and the low-side transistor ML is turned on, making the voltage $V_S$ at the switching terminal SW low.

The gate drive circuit 200 includes a high-side driver 202, a low-side driver 204, a level shifter 206, a dead time controller 210, and a diode D1, and is integrated on one semiconductor board.

The gate drive circuit 200 has an output pin HO connected to the gate of the high-side transistor MH and a switching pin or terminal VS connected to the source of the high-side transistor MH and the drain of the low-side transistor ML. The gate drive circuit 200 has an output pin LO connected to the gate of the low-side transistor ML.

The dead time controller 210 generates two pulse signals, i.e., a high-side pulse signal SH and a low-side pulse signal SL, that go complementarily high, on the basis of the input signal IN. The high-side pulse signal SH has high intervals corresponding to high intervals of the input signal IN, and the low-side pulse signal SL has high intervals corresponding to low intervals of the input signal IN. The dead time controller 210 inserts dead times during which both the high-side pulse signal SH and the low-side pulse signal SL are turned off, each time the input signal IN changes in level, so that the high-side transistor MH and the low-side transistor ML will not simultaneously be turned on.

The low-side driver 204 drives the low-side transistor ML on the basis of the low-side pulse signal SL. The high-side pulse signal SH is input through the level shifter 206 to the high-side driver 202. The high-side driver 202 has an upper power supply node N1 connected to a bootstrap pin VB and a lower power supply node N2 connected to the switching pin VS. The high-side driver 202 drives the high-side transistor MH on the basis of a high-side pulse signal SH' output from the level shifter 206 after it has shifted the level of the high-side pulse signal SH.

The bootstrap capacitor CB has one end connected to the switching pin VS and another end connected to the bootstrap pin VB. The diode D1 has a cathode connected through the bootstrap pin VB to the other end of the bootstrap capacitor CB and an anode to which a constant voltage $V_{REG}$ is applied.

The high-side driver 202 operates at a power supply voltage applied as the potential difference $V_{BS}=V_B-V_S$ between the bootstrap pin VB and the switching pin VS, i.e., the voltage across the bootstrap capacitor CB. Therefore, $V_{BS}$ will also be referred to as a high-side power supply voltage.

The dead time controller 210 controls the lengths of dead times Td during which the high-side transistor MH and the low-side transistor ML are simultaneously turned off on the basis of the high-side power supply voltage $V_{BS}$.

Figure 3:
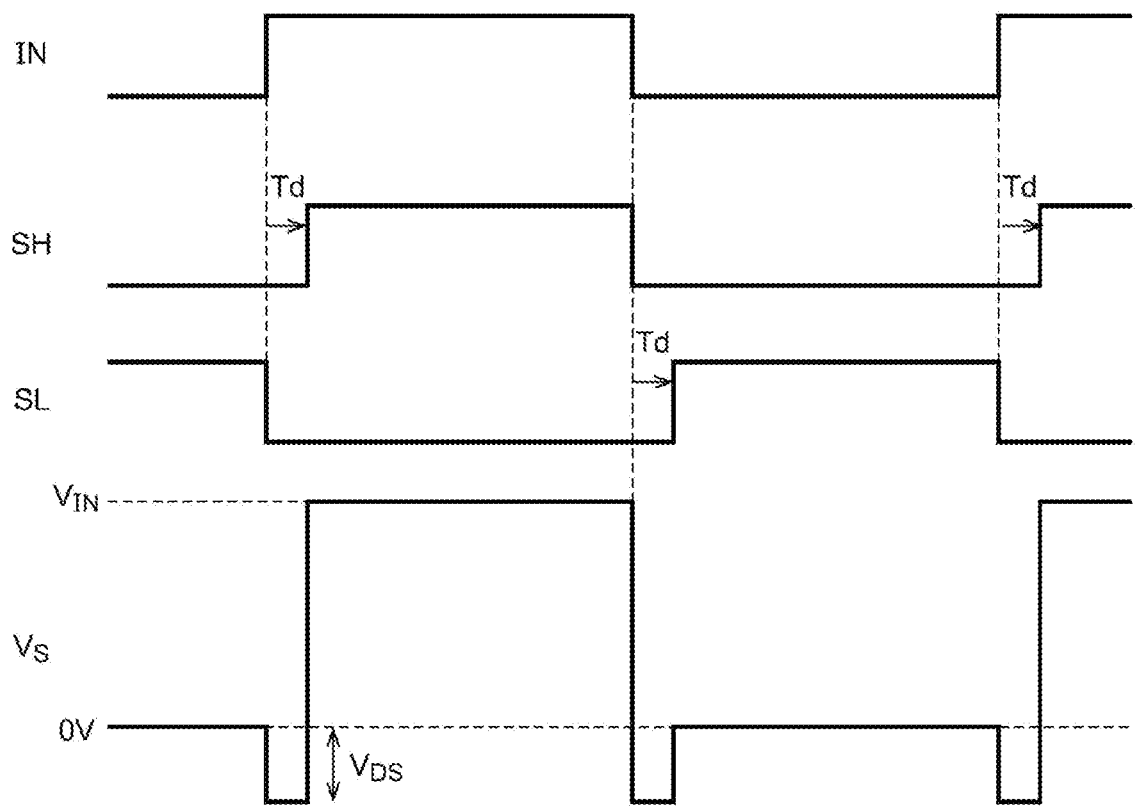
FIG. 3 is a diagram illustrating the waveforms of signals of the switching circuit while in operation.

The switching circuit 100 is constructed as described above. FIG. 3 is a diagram illustrating the waveforms of signals of the switching circuit 100 while in operation. FIG. 3 illustrates the input signal IN, the high-side pulse signal SH, the low-side pulse signal SL, and the voltage $V_S$ at the switching terminal SW. The low-side pulse signal SL goes low at a positive-going edge of the input signal IN. The high-side pulse signal SH goes high after elapse of the dead time Td from the positive-going edge of the input signal IN. The high-side pulse signal SH goes low at a negative-going edge of the input signal IN. The low-side pulse signal SL goes high after elapse of the dead time Td from the negative-going edge of the input signal IN. During the dead time Td, the voltage $V_S$ at the switching terminal SW, also referred to as the switching voltage $V_S$, becomes a negative voltage depending on the drain-to-source voltage $V_{DS}$ of the low-side transistor ML through which a reverse current flows.

Figure 4:
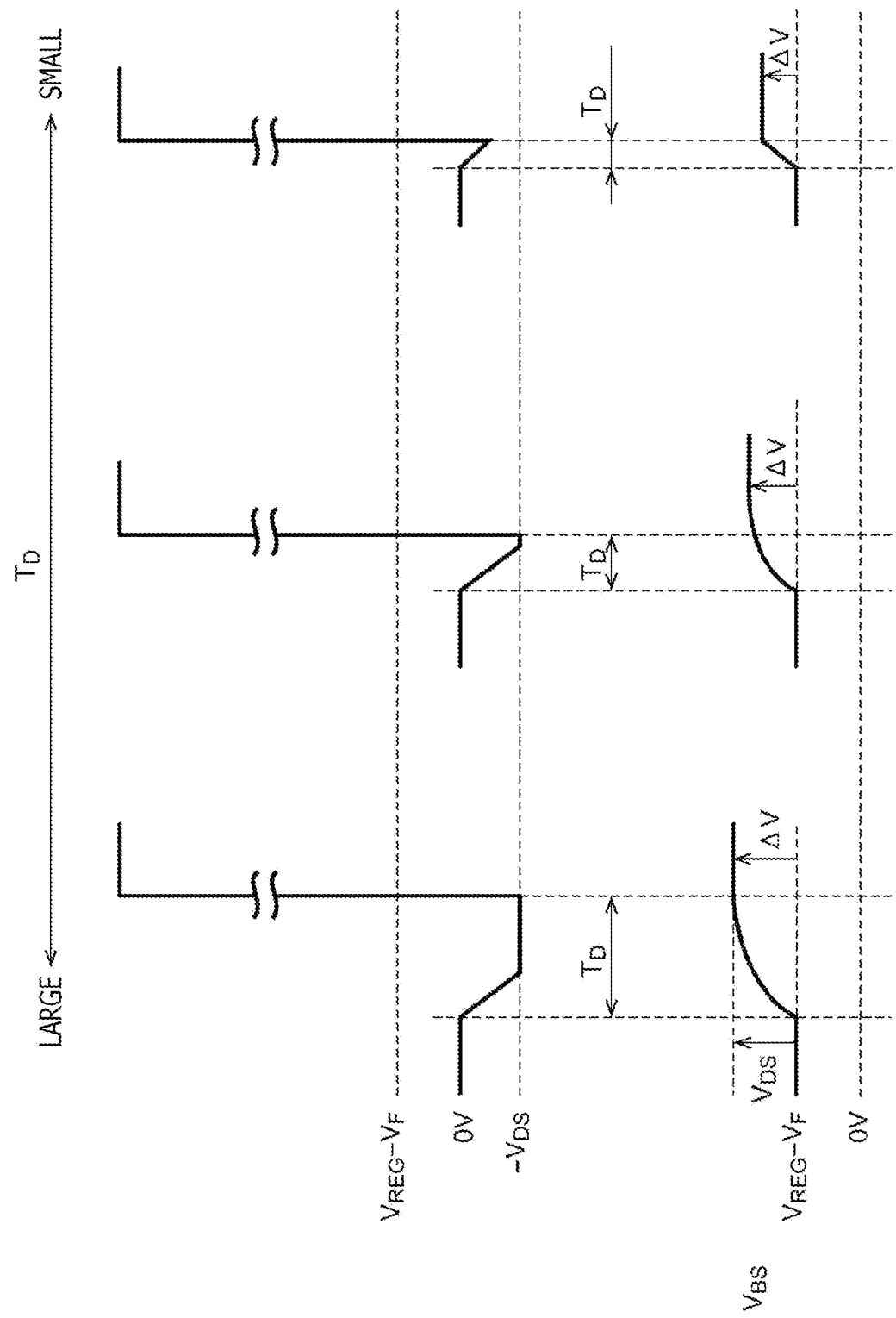
FIG. 4 is a diagram illustrating the manner in which a bootstrap capacitor CB is charged.

FIG. 4 is a diagram illustrating the manner in which the bootstrap capacitor CB is charged. While the switching voltage $V_S$ is low, i.e., 0 V, 0 V is applied to the one end of the bootstrap capacitor CB and a voltage of $V_{REG}-Vf$ is applied to the other end thereof. Therefore, the voltage $V_{BS}$ across the bootstrap capacitor CB becomes $V_{REG}-Vf$. In the subsequent dead time Td, when the voltage $V_S$ at the one end of the bootstrap capacitor CB becomes $-V_{DS}$, the bootstrap capacitor CB is further charged, resulting in a further rise $\Delta V$ in the voltage $V_{BS}$ across the bootstrap capacitor CB. The longer the dead time Td is, the larger the rise $\Delta V$ is, and the shorter the dead time Td is, the smaller the rise $\Delta V$ is.

Figure 5:
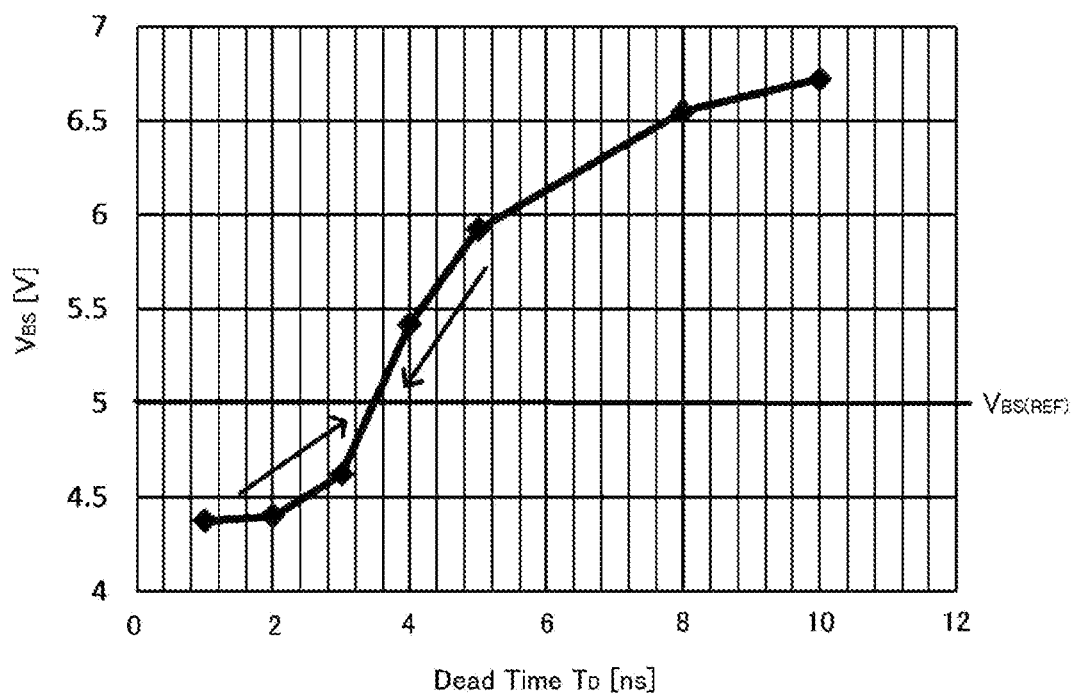
FIG. 5 is a diagram illustrating the relationship between the length of a dead time Td and a high-side power supply voltage VBS.

FIG. 5 is a diagram illustrating the relationship between the length of the dead time Td and the high-side power supply voltage $V_{BS}$. The high-side power supply voltage $V_{BS}$ increases monotonously with the dead time Td. The dead time controller 210 establishes a target value $V_{BS(REF)}$ for the high-side power supply voltage $V_{BS}$, and controls the dead time Td such that the dead time Td becomes shorter when the high-side power supply voltage $V_{BS}$ is higher than the target value $V_{BS(REF)}$ and the dead time Td becomes longer when the high-side power supply voltage $V_{BS}$ is lower than the target value $V_{BS(REF)}$, thereby preventing the high-side power supply voltage $V_{BS}$ from becoming an overvoltage.

Figure 6:
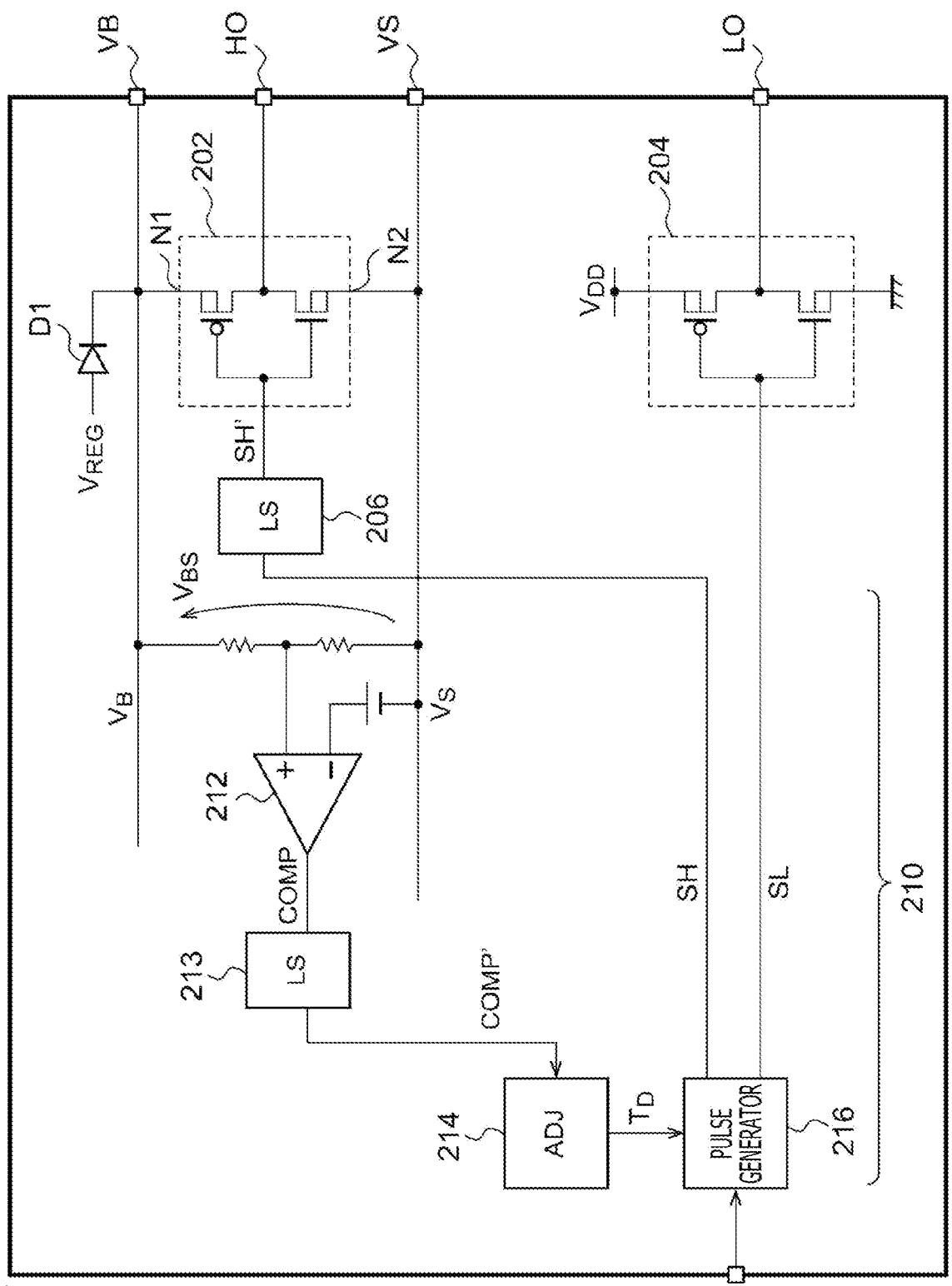
FIG. 6 is a circuit diagram, partly in block form, of a configurational example of the gate drive circuit.

FIG. 6 is a circuit diagram, partly in block form, of a configurational example of the gate drive circuit 200. The dead time controller 210 includes a comparator 212, a level shifter 213, a dead time adjusting circuit 214, and a pulse generator 216.

The comparator 212 operates using a switching line VS for a reference voltage. The comparator 212 compares a voltage produced by dividing the high-side power supply voltage $V_{BS}$ with a predetermined threshold voltage $V_{TH}$, and outputs a comparison signal COMP. The comparison signal COMP is converted, by the level shifter 213, into a comparison signal COMP' using a ground voltage of 0 V as a reference voltage. The dead time adjusting circuit 214 increases or reduces the set value of the dead time Td depending on the value of the comparison signal COMP'. The pulse generator 216 generates two pulse signals SH and SL on the basis of the set value of the dead time Td adjusted by the dead time adjusting circuit 214. The pulse generator 216 is not limited to any particular configuration, and may be a combination of an up counter or down counter whose count varies depending on the output from the dead time adjusting circuit 214 and a flip-flop. Alternatively, the pulse generator 216 may include a delay circuit whose delay varies depending on the output from the dead time adjusting circuit 214.

Figure 7:
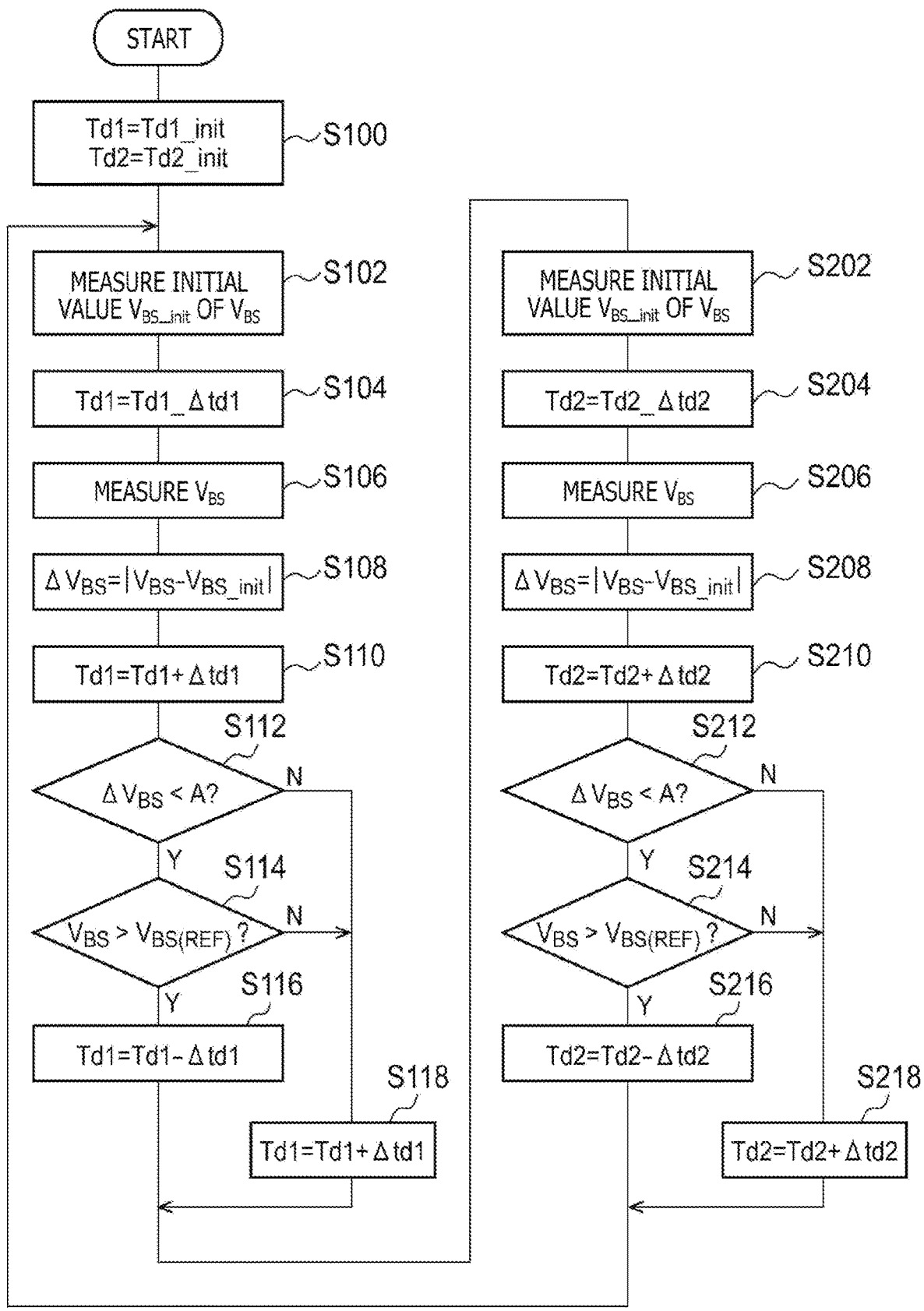
FIG. 7 is a flowchart of a dead time optimizing process carried out by a dead time controller illustrated in FIG. 6.

FIG. 7 is a flowchart of a dead time optimizing process carried out by the dead time controller 210 illustrated in FIG. 6. The dead time Td includes a dead time Td1 immediately after a positive-going edge of the input signal IN and a dead time Td2 immediately after a negative-going edge of the input signal IN. Since the dead time Td1 and the dead time Td2 suffer from respective independent factors for varying themselves, the dead time controller 210 should control the two dead times Td1 and Td2 independently of each other.

First, the dead time controller 210 sets the two dead times Td1 and Td2 to respective initial values Td1_init and Td2_init in step S100.

Then, the dead time controller 210 measures an initial value $V_{BS\_init}$ of the high-side power supply voltage $V_{BS}$ in step S102. Then, the dead time controller 210 gives perturbation to the dead time Td1 in step S104. The dead time Td1 should be as short as possible for higher efficiency as long as no through current flows. Therefore, the perturbation is given in a direction to reduce the dead time Td1, as follows:

$$Td1=Td1-\Delta td1$$

where $\Delta td1$ represents a perturbation range.

The high-side power supply voltage $V_{BS}$ to which the perturbation has been given is measured in step S106, and a fluctuation range $\Delta V_{BS}=|V_{BS}-V_{BS\_init}|$ of the high-side power supply voltage $V_{BS}$ to which the perturbation has been given is calculated in step S108. Then, the perturbation is canceled in step S110, as follows:

$$Td1=Td1+\Delta td1$$

In a region where the dead times Td1 and Td2 are small, the sensitivity of the high-side power supply voltage $V_{BS}$ to the dead times Td1 and Td2 is lowered, as illustrated in FIG. 5. In this region, there is a high risk of a through current to flow. In order to avoid the risk, the fluctuation range $\Delta V_{BS}$ due to the perturbation is compared with a minute threshold value A in step S112. If $\Delta V_{BS}<A$ (Y in step S112), then, since there is a possibility that a through current may flow, the dead time Td1 is increased in step S116.

If $\Delta V_{BS}>A$ (N in step S112), then the possibility that a through current may flow is low. In this case, the high-side power supply voltage $V_{BS}$ is compared with its target level $V_{BS(REF)}$ in step S114. If $V_{BS}>V_{BS(REF)}$ (Y in step S114), then the dead time Td1 is reduced in step S116. If $V_{BS}<V_{BS(REF)}$ (N in step S114), then the dead time Td1 is increased in step S118.

In steps S202 through S218, the same process as steps S102 through S118 is carried out on the dead time Td2.

An application of the gate drive circuit 200 will be described below.

Figure 8:
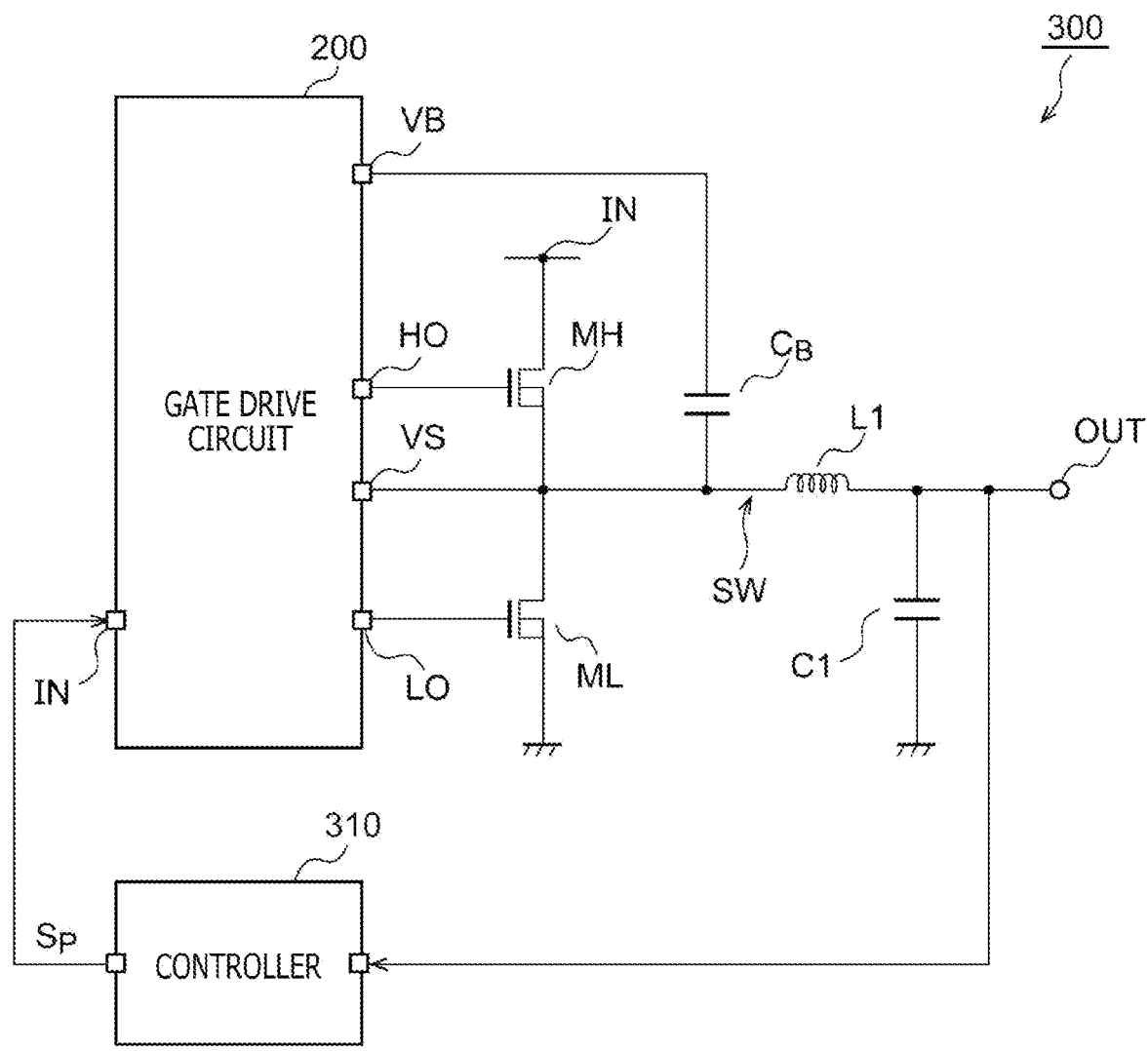
FIG. 8 is a circuit diagram, partly in block form, of a DC/DC converter incorporating the gate drive circuit.

FIG. 8 is a circuit diagram, partly in block form, of a DC/DC converter 300 incorporating the gate drive circuit 200. The DC/DC converter 300 is a step-down, i.e., buck, converter and includes, in addition to the gate drive circuit 200, an inductor L1, an output capacitor C1, and a controller 310. The controller 310 acts as a pulse modulator for generating a pulse signal $S_p$ that is modulated in order to cause an output voltage or an output current of the DC/DC converter 300 to approach a target state. The pulse signal $S_p$ is supplied to the input terminal IN of the gate drive circuit 200.

Figure 9:
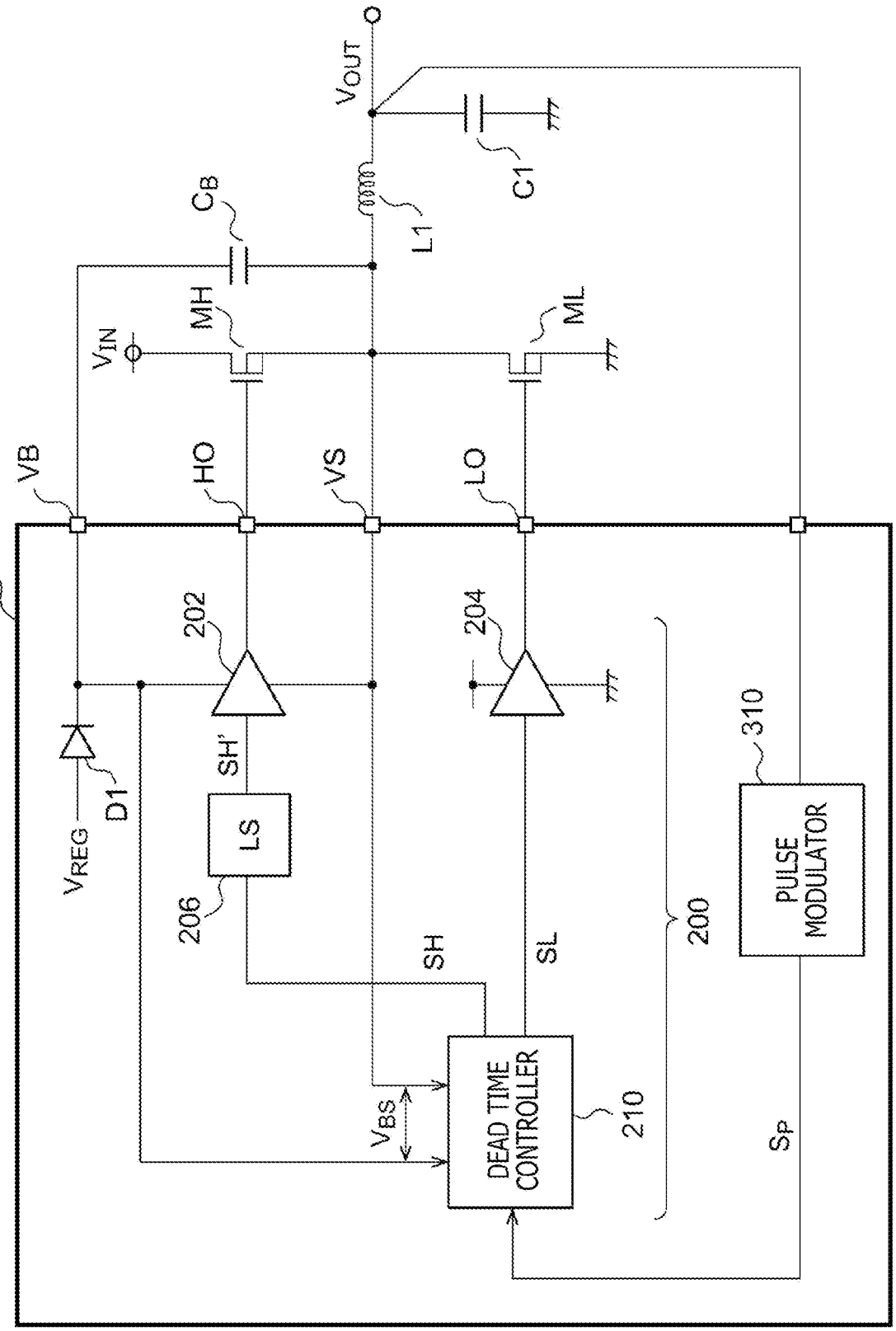
FIG. 9 is a circuit diagram, partly in block form, of a DC/DC converter according to a modification.

FIG. 9 is a circuit diagram, partly in block form, of a DC/DC converter 300 according to a modification. According to the modification, the controller 310 and the gate drive circuit 200 illustrated in FIG. 8 are integrated in an IC 400, i.e., a control circuit of the DC/DC converter 300.

In a case where the switching circuit is constructed as a digital control power supply, then the pulse modulator 310 may generate a duty cycle command value instead of the pulse signal $S_p$, and the dead time controller 210 may generate a high-side pulse signal SH and a low-side pulse signal SL on the basis of the duty cycle command value.

The application of the gate drive circuit 200 is not limited to the step-down converter. FIGS. 10A through 10F are circuit diagrams of DC/DC converters each incorporating the gate drive circuit. The gate drive circuit 200 can be used to drive a pair of transistors A and B of a step-down converter illustrated in FIG. 10A. This application has been described above with reference to FIG. 8.

The gate drive circuit 200 is also applicable to a forward converter illustrated in FIG. 10B. Specifically, as illustrated in FIG. 10B, the gate drive circuit 200 can be used to drive a pair of a high-side transistor B and a low-side transistor A on the primary side.

The gate drive circuit 200 is also applicable to a half-bridge converter illustrated in FIG. 10C. Specifically, as illustrated in FIG. 10C, the gate drive circuit 200 can be used to drive a pair of a high-side transistor B and a low-side transistor A on the primary side.

The gate drive circuit 200 is also applicable to a full-bridge converter illustrated in FIG. 10D. Specifically, as illustrated in FIG. 10D, the gate drive circuit 200 can be used to drive a pair of a high-side transistor B and a low-side transistor A on the primary side and a pair of a high-side transistor D and a low-side transistor C on the primary side.

The gate drive circuit 200 is also applicable to a current-doubler synchronous rectifier illustrated in FIG. 10E. Specifically, as illustrated in FIG. 10E, the gate drive circuit 200 can be used to drive a pair of a high-side transistor B and a low-side transistor A on the primary side.

The gate drive circuit 200 is also applicable to a secondary-side full-bridge synchronous rectifier illustrated in FIG. 10F. Specifically, as illustrated in FIG. 10F, the gate drive circuit 200 can be used to drive a pair of a high-side transistor B and a low-side transistor A on the primary side or a pair of a high-side transistor C and a low-side transistor D on the primary side. Furthermore, the gate drive circuit 200 can be used to drive a pair of a high-side transistor F and a low-side transistor E on the secondary side or a pair of a high-side transistor G and a low-side transistor H on the secondary side.

Embodiment 2

Figure 11:
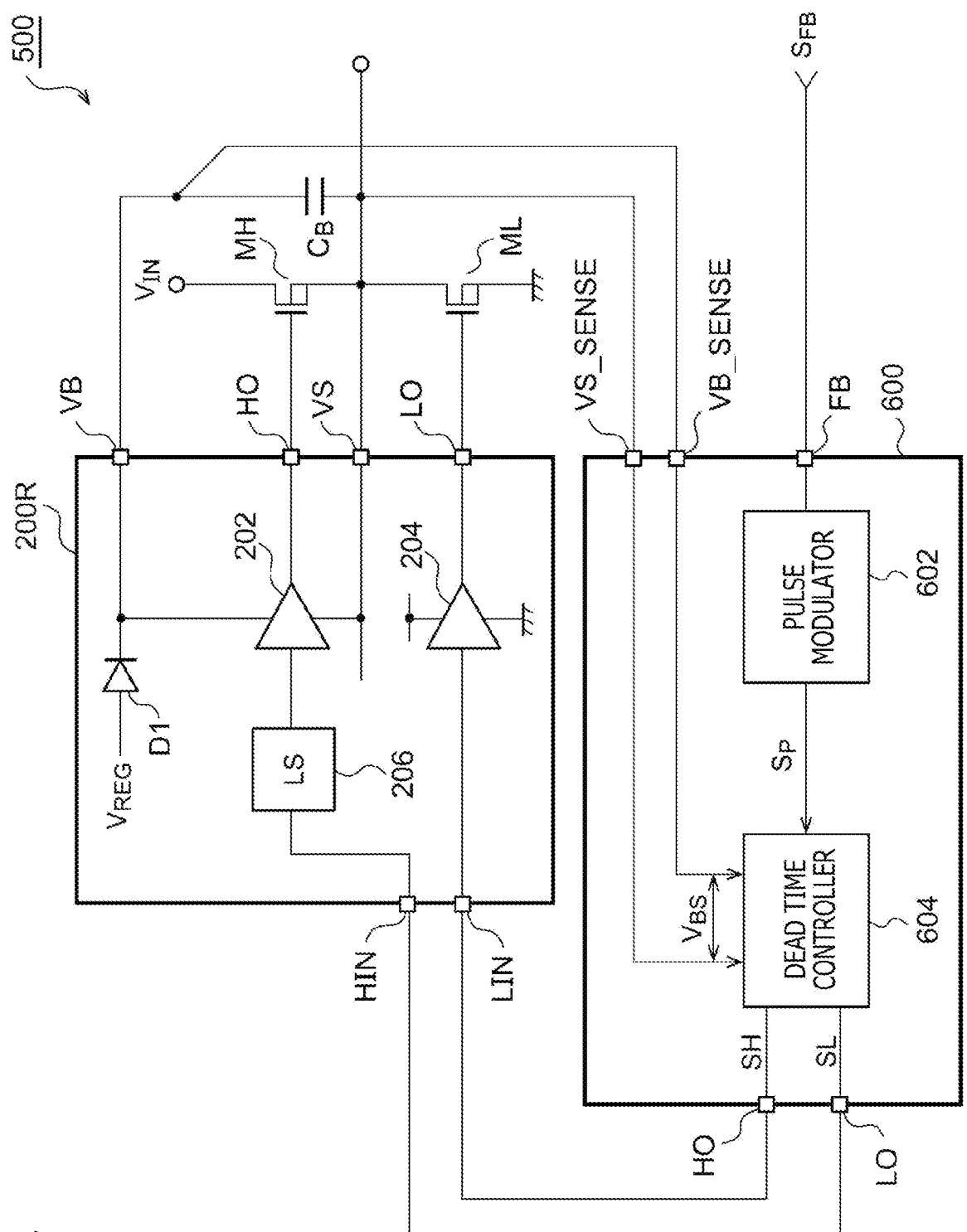
FIG. 11 is a circuit diagram, partly in block form, of a switching circuit according to Embodiment 2 of the present disclosure.

According to Embodiment 1, the gate drive circuit 200 has a function to automatically adjust the dead time. However, the present disclosure is not limited to such a detail. FIG. 11 is a circuit diagram, partly in block form, of a switching circuit 500 according to Embodiment 2 of the present disclosure. The switching circuit 500 includes a gate drive circuit 200R and a controller 600.

The gate drive circuit 200R has input terminals HIN and LIN and drives the high-side transistor MH and the low-side transistor ML on the basis of pulse signals applied respectively to the input terminals HIN and LIN.

The controller 600 includes a pulse modulator 602 and a dead time controller 604.

The pulse modulator 602 generates a pulse signal $S_p$ that is modulated in order to cause a feedback signal $S_{FB}$ indicative of the state of an apparatus, a circuit, or a system that incorporates the switching circuit 500 to approach a predetermined target state. The dead time controller 604 generates a high-side pulse signal SH and a low-side pulse signal SL on the basis of the pulse signal $S_p$. The dead time controller 604 controls the lengths of dead times Td during which the high-side transistor MH and the low-side transistor ML are simultaneously turned off on the basis of the voltage $V_{BS}$ across the bootstrap capacitor CB. The dead time controller 604 is the same as the dead time controller 210 illustrated in FIG. 2.

In a case where the switching circuit is constructed as a digital control power supply, then the pulse modulator 602 may generate a duty cycle command value instead of the pulse signal $S_p$, and the dead time controller 604 may generate a high-side pulse signal SH and a low-side pulse signal SL on the basis of the duty cycle command value.

Figure 12:
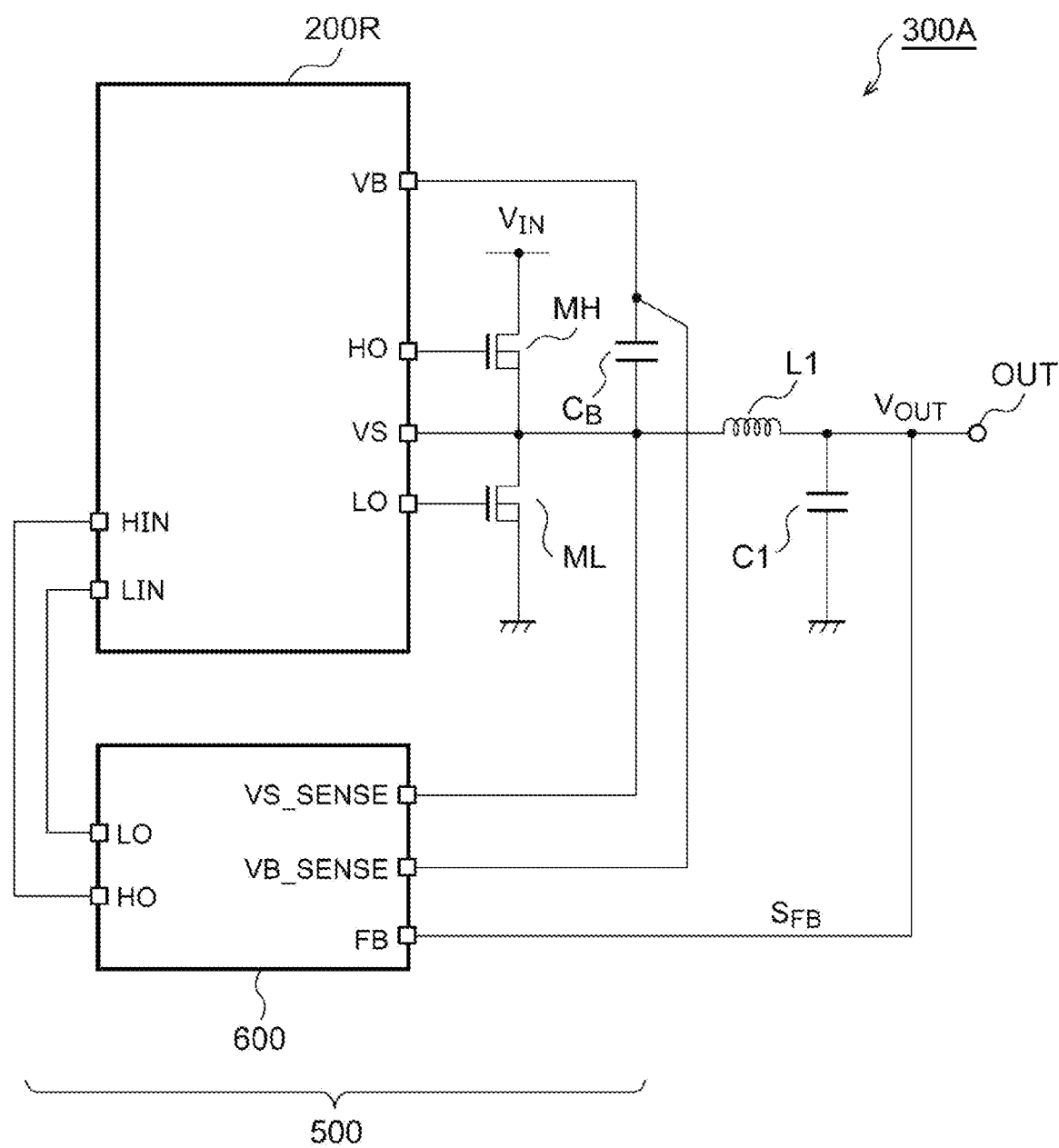
FIG. 12 is a circuit diagram, partly in block form, of a DC/DC converter incorporating the switching circuit illustrated in FIG. 11.

FIG. 12 is a circuit diagram, partly in block form, of a DC/DC converter 300A incorporating the switching circuit 500 illustrated in FIG. 11. The DC/DC converter 300A is a step-down, i.e., buck, converter and includes, in addition to the switching circuit 500, an inductor L1 and a capacitor C1.

The application of the switching circuit 500 is not limited to the step-down converter, and may be used in any of the various switching power supplies illustrated in FIGS. 10B through 10F.

Figure 13:
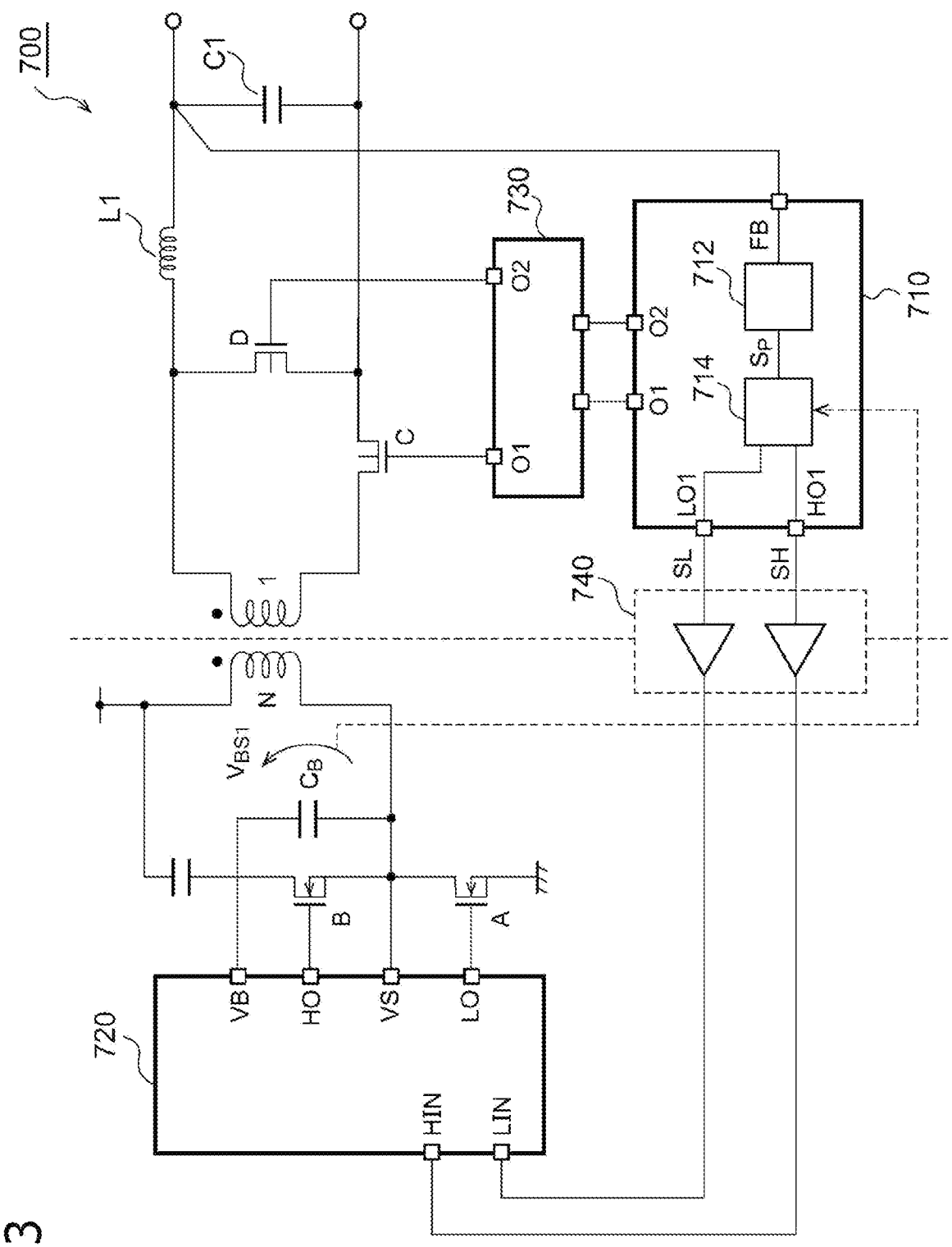
FIG. 13 is a circuit diagram, partly in block form, of an insulated power supply.

FIG. 13 is a circuit diagram, partly in block form, of an insulated power supply 700. The insulated power supply 700 is similar to the forward converter illustrated in FIG. 10B, and includes a controller 710, a gate drive circuit 720 on the primary side, a gate drive circuit 730 on the secondary side, and a coupler 740. The primary side and the secondary side are insulated from each other, with the controller 710 being disposed on the secondary side.

The controller 710 is constructed similarly to the controller 600 illustrated in FIG. 11, and includes a pulse modulator 712 and a dead time controller 714. Those blocks of the controller 710 that are involved in the control of the secondary side are omitted, and may be arranged according to the related art. The pulse modulator 712 generates a pulse signal $S_p$ in order to cause a feedback signal $S_{FB}$ to approach a target value. The dead time controller 714 generates a high-side pulse signal SH and a low-side pulse signal SL on the basis of the pulsed signal $S_p$ and outputs the high-side pulse signal SH and the low-side pulse signal SL from respective output pins HO1 and LO1. The high-side pulse signal SH and the low-side pulse signal SL are supplied through the coupler 740 to the gate drive circuit 720 on the primary side. The dead time controller 714 is supplied with information regarding a voltage $V_{BS}$ between VB and VS pins on the primary side.

In a case where the switching circuit is constructed as a digital control power supply, then the pulse modulator 712 may generate a duty cycle command value instead of the pulse signal $S_p$, and the dead time controller 714 may generate a high-side pulse signal SH and a low-side pulse signal SL on the basis of the duty cycle command value.

Information INFO regarding the voltage $V_{BS}$ may be generated and transmitted in various ways. For example, the voltage $V_{BS}$ may be compared in magnitude with the target value $V_{BS(REF)}$ on the primary side and a digital signal representing the result of comparison may be transmitted from the primary side through a coupler to the secondary side. Alternatively, an analog signal representing an error of the voltage $V_{BS}$ with respect to the target value $V_{BS(REF)}$ may be generated on the primary side and may be transmitted from the primary side through a photocoupler to the secondary side. Further alternatively, a digital signal representing an error of the voltage $V_{BS}$ with respect to the target value $V_{BS(REF)}$ may be generated on the primary side and may be transmitted from the primary side through a coupler to the secondary side. The dead time controller 714 performs feedback control on the dead times of the high-side pulse signal SH and the low-side pulse signal SL in order to cause the voltage $V_{BS}$ to approach the target value $V_{BS(REF)}$ on the basis of the information INFO transmitted from the primary side.

The embodiments of the present disclosure have been described above. However, the embodiments are illustrated by way of example and the components and processes of the embodiments and their combinations may be modified within the scope of the present disclosure as anticipated by those skilled in the art. Some modifications of the embodiments will be described below.

The process of feedback of the dead times is not limited to the sequence according to the flowchart illustrated in FIG. 7. An error of the high-side power supply voltage $V_{BS}$ with respect to the target value $V_{BS(REF)}$ may be amplified by an error amplifier, and the lengths of the deal times may be set depending on an output signal from the error amplifier. Alternatively, the high-side power supply voltage $V_{BS}$ may be converted into a digital signal, and the lengths of the dead times may be feedback-controlled by a proportional-integral (PI) compensator or a proportional-integral-differential (PID) compensator in order to cause an error of the high-side power supply voltage $V_{BS}$ to approach zero.

The switching circuit is used in various applications including power supplies, motor drive circuits, etc. The present disclosure is applicable to applications other than power supplies.

Although the preferred embodiments of the present disclosure have been described in detail above, it should be understood that the embodiments illustrate principles and applications by way of example and various many changes and modifications may be made therein without departing from the scope of the disclosure as called for in the attached claims.

What is claimed is:

1. A gate drive circuit for use in a switching circuit, the gate drive circuit comprising:
    a switching terminal connected to a node, wherein
        the node is connected to a high-side transistor of the switching circuit, a low-side transistor of the switching circuit, and a first end of a bootstrap capacitor of the switching circuit, and
        the high-side transistor is connected in series with the low-side transistor;
    a bootstrap terminal connected to a second end of the bootstrap capacitor;
    a high-side driver that includes:
        an output terminal connected to a gate of the high-side transistor;
        an upper power supply node connected to the bootstrap terminal; and
        a lower power supply node connected to the switching terminal;
    a low-side driver that includes an output terminal connected to a gate of the low-side transistor;
    a rectifying device configured to apply a constant voltage to the bootstrap terminal; and
    a dead time controller configured to control a length of a dead time during which the high-side transistor and the low-side transistor are simultaneously turned off, wherein the length of the dead time is controlled based on a potential difference between the bootstrap terminal and the switching terminal,
    wherein the dead time controller is further configured to feedback-control the dead time to cause the potential difference to approach a predetermined target voltage.

2. The gate drive circuit according to claim 1, wherein
    the dead time controller includes a comparator,
    the comparator is configured to compare the potential difference with the predetermined target voltage, and
    the dead time controller is further configured to increase or reduce the dead time based on an output signal from the comparator.

3. The gate drive circuit according to claim 1, wherein the dead time controller is further configured to control a dead time during which the high-side transistor is turned on and a dead time during which the low-side transistor is turned on, independently of each other.

4. A control circuit for controlling a direct current/direct current converter, comprising:
the gate drive circuit according to claim 1.

5. A control circuit for controlling a switching circuit, the control circuit comprising:
a pulse modulator configured to generate a pulse signal that is modulated to cause a feedback signal to approach a predetermined target value, wherein the switching circuit includes:
a high-side transistor,
a low-side transistor, and
a gate drive circuit, connected to a bootstrap capacitor, to:
drive the high-side transistor based on a high-side pulse signal, and
drive the low-side transistor based on of a low-side pulse signal; and
a dead time controller configured to:
generate the high-side pulse signal and the low-side pulse signal based on the generated pulse signal; and
control a length of a dead time during which the high-side transistor and the low-side transistor are simultaneously turned off, wherein the length of the dead time is controlled based on a voltage across the bootstrap capacitor,
wherein the dead time controller is further configured to feedback-control the dead time to cause the voltage across the bootstrap capacitor to approach a predetermined target voltage.

6. The control circuit according to claim 5, wherein
the dead time controller includes a comparator,
the comparator is configured to compare the voltage across the bootstrap capacitor with the predetermined target voltage, and
the dead time controller is further configured to increase or reduce the dead time based on an output signal from the comparator.

7. The control circuit according to claim 5, wherein the dead time controller is further configured to control a dead time during which the high-side transistor is turned on and a dead time during which the low-side transistor is turned on, independently of each other.

8. The control circuit according to claim 5, wherein the switching circuit is part of a switching power supply.

9. The control circuit according to claim 8, wherein
the switching power supply is an insulated power supply,
the gate drive circuit is disposed on a primary side of the insulated power supply, and the control circuit is disposed on a secondary side of the insulated power supply, and
the high-side pulse signal and the low-side pulse signal are supplied through a coupler to the gate drive circuit.

10. A switching power supply, comprising:
the control circuit according to claim 5.

* * * * *